United States Patent [19]
Hedrick et al.

[11] Patent Number: 5,919,596
[45] Date of Patent: *Jul. 6, 1999

[54] TOUGHENED PHOTOSENSITIVE POLYCYANURATE RESIST, AND STRUCTURE MADE THEREFROM AND PROCESS OF MAKING

[75] Inventors: Jeffrey C. Hedrick, Park Ridge, N.J.; Konstantinos Papathomas, Endicott, N.Y.; Stephen L. Tisdale, Hopewell Junction, N.Y.; Alfred Viehbeck, Fishkill, N.Y.; Jeffrey D. Gelorme, Plainville, Conn.; Voya Rista Markovich, Endwell, N.Y.; Thomas H. Lewis, Apalachin, N.Y.; Stephen Joseph Fuerniss, Endicott, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/798,592

[22] Filed: Feb. 11, 1997

Related U.S. Application Data

[62] Division of application No. 08/528,291, Sep. 14, 1995.
[51] Int. Cl.$^6$ .................................................. G03F 7/26
[52] U.S. Cl. ...................... 430/270.1; 430/325; 430/905; 522/31
[58] Field of Search ................................ 430/325, 270.1, 430/286.1, 905; 522/31

[56] References Cited

U.S. PATENT DOCUMENTS

| | | | |
|---|---|---|---|
| 5,215,860 | 6/1993 | McCormick et al. | 430/270.1 |
| 5,605,781 | 2/1997 | Gelorme et al. | 430/270.1 |

*Primary Examiner*—John S. Chu
*Attorney, Agent, or Firm*—Daniel P. Morris

[57] ABSTRACT

Disclosed is an admixture which is curable to form a crack resistant, photosensitive polycyanurate resist. Also disclosed is a structure for its use and process of making. The resist can be tailored to be either positively or negatively sensitive to actinic radiation. Because of its improved thermal and mechanical properties, the cured resist is suitable for use at high temperature, such as in electronic packaging applications.

5 Claims, 10 Drawing Sheets

→ POLYMERIZATION PRODUCT

TOUGHENED PHOTOSENSITIVE POLYCYANURATE RESIST, AND STRUCTURE MADE THEREFROM AND PROCESS OF MAKING

This is a division of application Ser. No. 08/528,291, filed Sep. 14, 1995, pending.

TECHNICAL FIELD

Photoinduced polymerizable cyanate resin composition and process thereof, comprising a cationically polymerizable cyanate monomer, prepolymer and mixtures thereof, an effective amount of modifier to enhance the fracture toughness properties and, a catalytically effective amount of an organometallic complex salt as polymerization initiator, which upon photolysis is capable of liberating at least one coordination site, and the said metal cation in the organometallic complex is selected from elements of the Periodic Groups IVB, VB, VIB, VIIB, and VIIIB are disclosed.

BACKGROUND OF THE INVENTION

Radiation induced crosslinking reactions of functionalized monomers, oligomers, and polymers play an important role in a variety of commercial applications extending from the ultraviolet curing of varnishes and inks to the imaging of semiconductor chips. There is a need for high temperature resists, permanent dielectrics or solder masks having improved mechanical properties.

Recently several classes of cationic photoinitiators have been found and their use in combination with epoxies is described by G. E. Green, B. P. Stark, and S. A. Zahir, in J. Macromol. Sci. Revs. Macromol. Chem., C21, 187 (1981/82). However, many of these initiators are slow and inefficient and thus have limited practical value. Commercially, the most significant catalysts are the aryldiazonium, triphenylsulfonium and diphenyliodonium salts, with the most recently found compounds the diaryliodosyl and triarylsulfoxonium salts which possess anions of low nucleophilicity. These are known to liberate, upon irradiation, the corresponding Lewis acids $BF_3$, $BF_5$ etc., or the Bronsted acids $HB_4$, $HPF_6$, $HAsF_6$ etc., shown below:

A. Diazonium salts hv

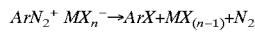

$$ArN_2^+ \, MX_n^- \rightarrow ArX + MX_{(n-1)} + N_2 \quad (I)$$

B. Diaryliodonium and Triarylsulfonium salts hv

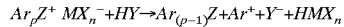

$$Ar_pZ^+ \, MX_n^- + HY \rightarrow Ar_{(p-1)}Z + Ar^+ + Y^- + HMX_n \quad (II)$$

HY=H-donor
$MX_n^- = BF_4^-$, $PF_6^-$, $AsF_6^-$, $SbF_6^-$ etc.
Z=iodine or sulfur The effectiveness of aryldiazonium salts as photoinitiators depends on the structure of either the cationic or the anionic moieties of these salts. Their spectral sensitivity can be varied by modifying the structure of the aryl part of the aryldiazonium compound. Generally when utilizing this type of initiator a thermal post treatment step is required after irradiation to achieve satisfactory cure of the epoxy resin. However, there are several drawbacks that limit the use of aryldiazonium salts as photoinitiators in many practical applications such as nitrogen evolution during the photolysis step, poor thermal stability and inherent moisture sensitivity.

Crivello in "Developments in Polymer Photochemistry 2" (N. S. Allen, ed.), P. 1 Applied Science Publ., London, 1981, postulated that the reaction mechanism involves homolytic cleavage of one of the aryl bonds induced by a photochemical reaction is the first reaction step, then a subsequent hydrogen abstraction from a suitable donor, followed by loss of a proton yields the Bronsted acid HX. This strong Bronsted acid HX, protonates the oxirane group as the initial step with subsequent ring opening polymerization taking place. Cycloaliphatic epoxies show higher reactivities than the glycidyl ethers and glycidyl esters. Most of the examples reported to date involve organometallic complexes that possess photolabile ligands such as carbon monoxide, olefins, and carbocyclic rings, as described by D. M. Allen, J. Photog. Sc., 24, 61 (1976) and H. Curtis, E. Irving, B. F. G. Johnson, Chem. Brit., 22, 327 (1986).

Numerous organometallic compounds, such as organometal carbonyl compounds, metallocenes and aluminum complexes can act as photoinitiators in the polymerization of epoxy functionalized polymers. K. Meier and H. Zweifel, J. Imag. Sci. 30, 174 (1986) have described iron arene salts having anions with low nucleophilicity. The photolysis of these compounds produces Lewis acids which can polymerize epoxy resins relatively easily. The development of insoluble networks requires a thermal activation step after the exposure step. Iron arene salts are generally prepared from the ferrocene according to the method reported by N. A. Nesmeyanov et al., Dokl. Akad. Nauk SSSR, 149, 615 (1963) as shown in FIGS. 1 and 2. Epoxide polymerization with iron arene complexes is exemplified in FIG. 3. During the photolytic process a ligand-exchanged iron complex having three coordinated epoxide functionalities is proposed to form. The ring opening polymerization of the epoxide is proposed to start in the ligand sphere of the iron cation as shown in FIG. 3.

An alternative to epoxy resin based materials are cyanate resins. Cyanate resins are more desirable compared to epoxy resins as resist materials due to their greater thermal and dimensional stability, better dielectric properties, and outstanding adhesive properties.

Cyanate ester resins are made from polyfunctional cyanate monomers as described in U.S. Pat. No. 4,094,852. Generally, a catalyst is employed to achieve lower curing temperatures and faster curing times. Thermally activated catalysts which are effective include acids, bases, salts, nitrogen and phosphorous compounds, i.e., Lewis acids such as $AlCl_3$, $BF_3$, $FeCl_3$, $TiCl_4$, $ZnCl_2$, $SnCl_4$; Bronsted acids such as HCl, $H_3PO_4$, aromatic hydroxy compounds such as phenol, p-nitrophenol, pyrocatechol, dihydroxynaphthalene; various other compounds such as sodium hydroxide, sodium methoxide, sodium phenoxide, trimethylamine, triethylamine, tributylamine, diazabicyclo[2.2.2]octane, quinoline, isoquinoline, tetrahydroquinoline, tetraethylammonium chloride, pyridine-N-oxide, tributylphosphine, zinc octoate, tin octoate, zinc naphthenate, and mixtures thereof U.S. Pat. No. 3,694,410 discloses the use of chelates of metal ions of the ionic or nonionic type with 1 to 6 or more chelate rings, to catalyze the formation of triazines from aromatic polyfunctional cyanates. Similarly, U.S. Pat. No. 4,528,366 has shown that cobalt salts of $C_{6-20}$ carboxylic acids are useful catalysts for triazine formation, preferably cobalt octoate and cobalt naphthenate. U.S. Pat. Nos. 4,604,452 and 4,608,434 disclose that alcoholic solutions of metal carboxylates are effective catalyst compositions for triazine formation by heating. Organometallic cobalt compounds have been used to catalyze the trimerization of acetylenes as described in U.S. Pat. No. 4,183,864 and the co-trimerization of acetylenes and nitriles as described in U.S. Pat. No. 4,328,343. The photocatalyzed trimerization of aryl isocyanates using metal carbonyl complexes has been disclosed by E. Martelli, C. Pellizzi, and G. Predieri, J. Molec. Catalysis 22, 89–91 (1983). Energy polymerizable compositions comprising ionic salts of organometallic complex cations and cationically sensitive materials and the curing thereof has been taught in European Patent Nos. 109,851; 094,914; and 094,915. U.S. Pat. No. 4,554,346 discloses photocurable resins from cyanate ester compounds. The inventors used mixtures of polyfunctional cyanate esters with at least one compound having hydroxy groups and radical polymerizable unsaturated double bonds, the compounds used in quantities such that the ratio of cyanate groups to the hydroxy groups is in the range from 1:0.1 to about 1:2, and a radical polymerization photoinitiator, at elevated temperature. These materials would not be expected to yield the same polytriazine materials which can be obtained from direct polymerization of the cyanates only, and would be expected to lack the high thermal stability of the current invention.

Recently, Pujol et al. (U.S. Pat. No. 5,143,785) disclosed an energy-curable one-part adhesive composition comprising of the reaction product of an admixture of a cyanate ester resin, a thermoplastic polymer and a catalyst which can be thermally or photochemically activated. This composition was designed for fabricating adhesive films for bonding of electronic components such as semiconductor or integrated circuits to circuit boards or substrates. Their preferred adhesive composition included a silane coupling agent and may contain electrically conductive particles to enhance thermal conductivity between the die and substrate. This composition was not intended for forming dielectric patterns or as a resist material. The addition of the thermoplastic polymer improved the film-forming properties of these adhesives but was not correlated to phase separation or the effect of composite morphology on material properties.

Gelorme et al. (EP 0143087A1) disclosed a photoresist composition containing a curable cyanate ester resin or prepolymer and a cationic photoinitiator with non-ethylenic unsaturated monomers or polymers. These compositions were directed for use as photosensitive materials that could act as positive or negative resists. Patterns of the compositions were formed by exposing the photoresist material to actinic light (e.g., X-rays, ultraviolet radiation or electron beam radiation) through a mask to image and selectively crosslink the exposed areas. These photoprocessable cyanate resin based materials offered the benefits of good resolution and greater temperature stability than photosensitive epoxy resin based materials. The later is particularly advantageous for use as permanent resist of solder masks layers which typically experience elevated temperatures (up to 360° C.) during soldering or chip joining operations. In addition, these formulations could be made to be positive or negative acting resists, depending on the type of photoinitiator selected. However, these compositions possessed brittle characteristics inherent with cured cyanate thermosets which resulted in marginal mechanical properties.

U.S application Ser. No. 07/923,723, filed on Jul. 31, 1992, the teaching of which is hereby incorporated by reference, described a conventionally processed, energy curable cyanate resin or prepolymer having incorporated therein a reactive, fluorinated thermoplastic oligomer modifier to reduce brittleness. The electrical and mechanical properties of the composition, such as fracture toughness, dielectric constant, coefficient of thermal expansion, flame retardancy, moisture uptake and glass transition temperature could be selected within value ranges. Conductivity of heat and of electricity also could be selected, by loading with a judicious choice and amount of organic or metal particles.

The reduced brittleness was attributed to the dissolution of the thermoplastic oligomer modifier and the thermoset cyanate resin to form a separation of the thermoset and thermoplastic during curing into submicron scale phases.

The reactive cyanate oligomers embodied in the invention are taught in U.S. application Ser. No. 07/923,723, as are the thermoplastic, fluorosubstituted modifiers, the formation of the microphases, fillers and workable and preferred concentration ranges. Although the final product possessed an excellent combination of thermal, electrical and mechanical for a variety of uses, it was not photoimageable. The present invention renders such compositions photoimageable for applications requiring improved thermal and mechanical properties.

SUMMARY OF THE INVENTION

The present invention relates to a photoimageable, curable thermosetting resin composition having enhanced fracture toughness as a result of the incorporation of reactive thermoplastic oligomers therein. More specifically, the present invention relates to an energy polymerizable composition comprising a cyanate resin and a fluorinecontaining homo-, co-, or multicomponent thermoplastic polymer which is soluble in the cyanate resin melt. The thermoplastic polymer undergoes an in-situ phase separation process during cure to form a microphase separated multiphase cyanate thermoset material.

Furthermore, the present invention relates to a photoimageable composition comprising a cyanate resin which optionally contains fluorine, bromine or both and a homo-, co-, or multicomponent thermoplastic polymer component which is fluorine-containing and is soluble in the cyanate resin melt. The thermoplastic polymer undergoes an in-situ phase separation process during cure to form a microphase-separated multiphase thermoset material.

Furthermore, the present invention relates to a curable material for use in electronic packaging applications such as circuit boards or for use as a permanent resist wherein a thermoset material is required which has high fracture toughness, improved mechanical performance and conventional processability (i.e., processable with existing manufacturing technology).

More particularly, this invention relates to a modified light-sensitive thermosetting material useful in the fabrication of printed circuit boards, semiconductor chip carriers, metal-core boards, cards, multichip modules, and multilayer thin film circuit structures, which may include more than one conductive layer and may incorporate electrical interconnections including through-holes or vias between two or more conductive layers or blind vias between two layers. This invention is well suited for use as a substrate material for surface mounted electronic components.

This invention relates to new photosensitive cyanate compositions and simplified lithographic processes achieved by their use. More particularly, this invention is directed to the use of novel modified cyanate resin based materials as high temperature stable, low dielectric, imageable layers for use as photoresists and in the formation of imaged dielectrics and the formation of thin film redistribution layers for increased density packaging. The modifier suitable for use are tough, ductile fluorine-containing poly(arylene ether) engineering thermoplastic possessing relatively high glass transition temperatures (Tg) (i.e. preferably between about 140–300° C.) which, when cured with the cyanate resin, do not reduce high temperature stability and solvent compatibility of the initial cyanate resin based thermoset material.

DETAILED DESCRIPTION OF THE INVENTION

Figure 1:
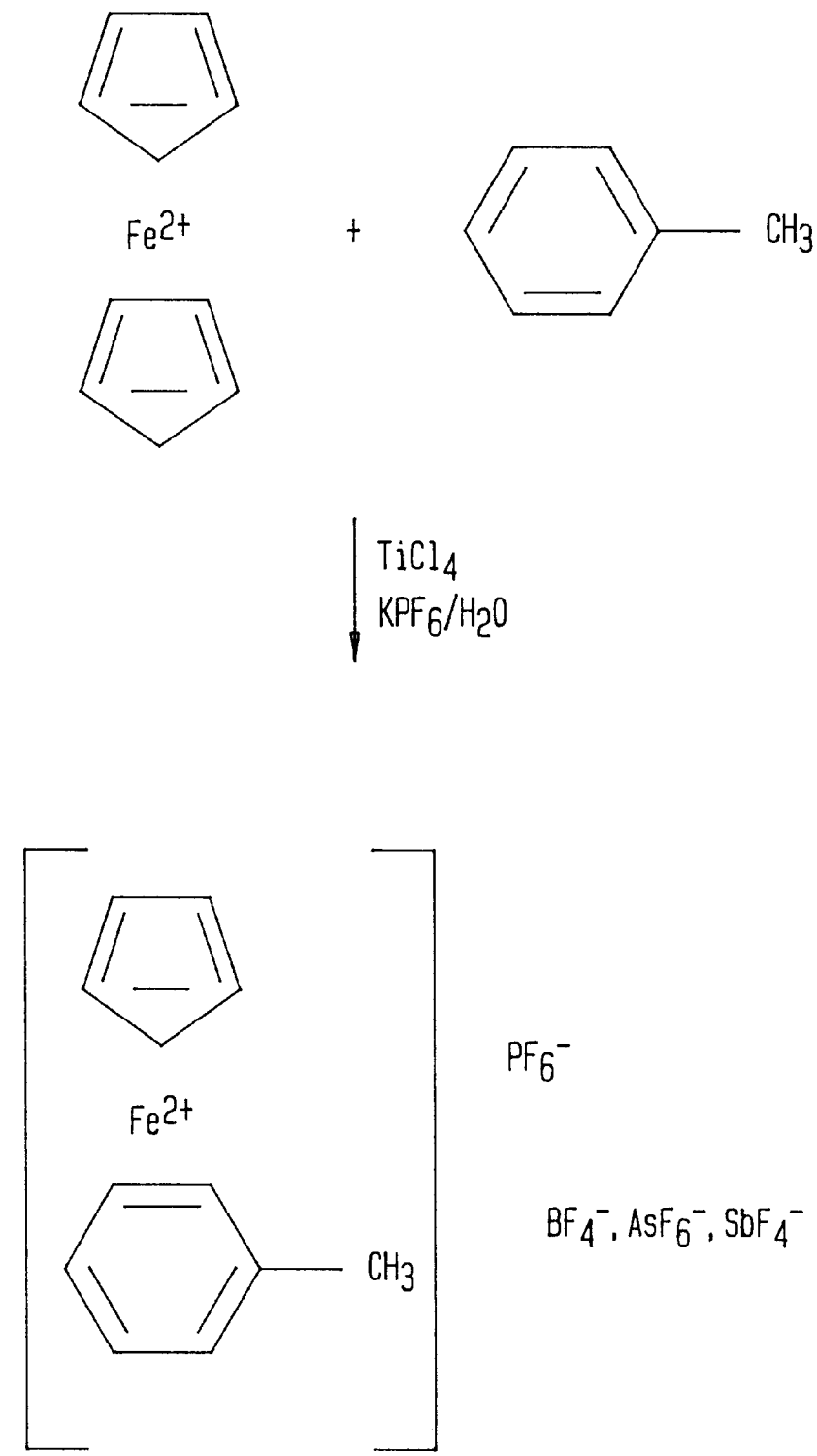
FIG. 1 is a scheme showing the synthesis of iron arene salts.
Figure 2:
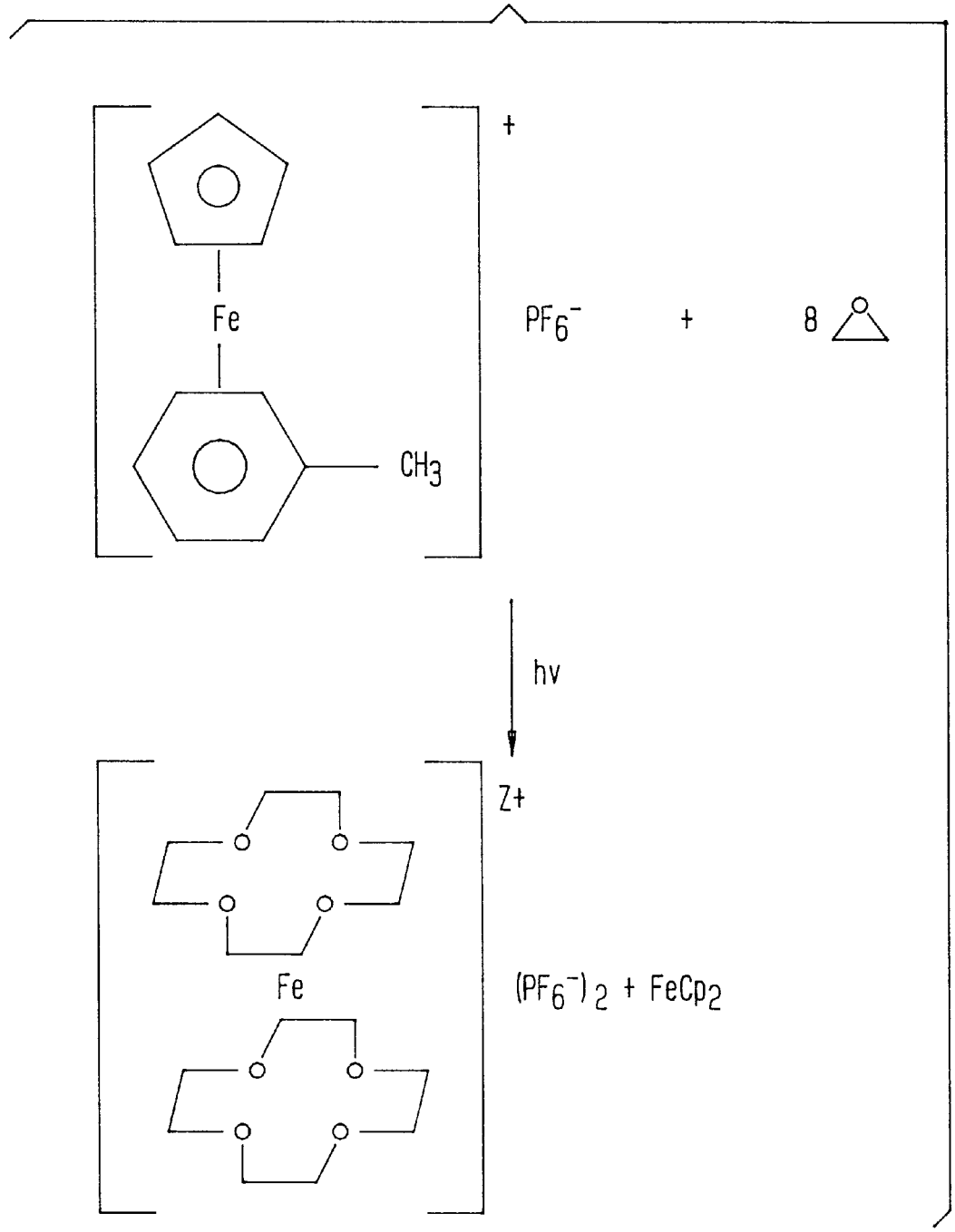
FIG. 2 is a scheme illustrating the formation of Iron(1,4, 7,10-tetraoxacyclododecane)(PF$_6$)$_2$ by irradiation of ethylene oxide in the presence of CpFe(toluene)(PF$_6^-$), where Cp=cyclopentadiene.
Figure 3:
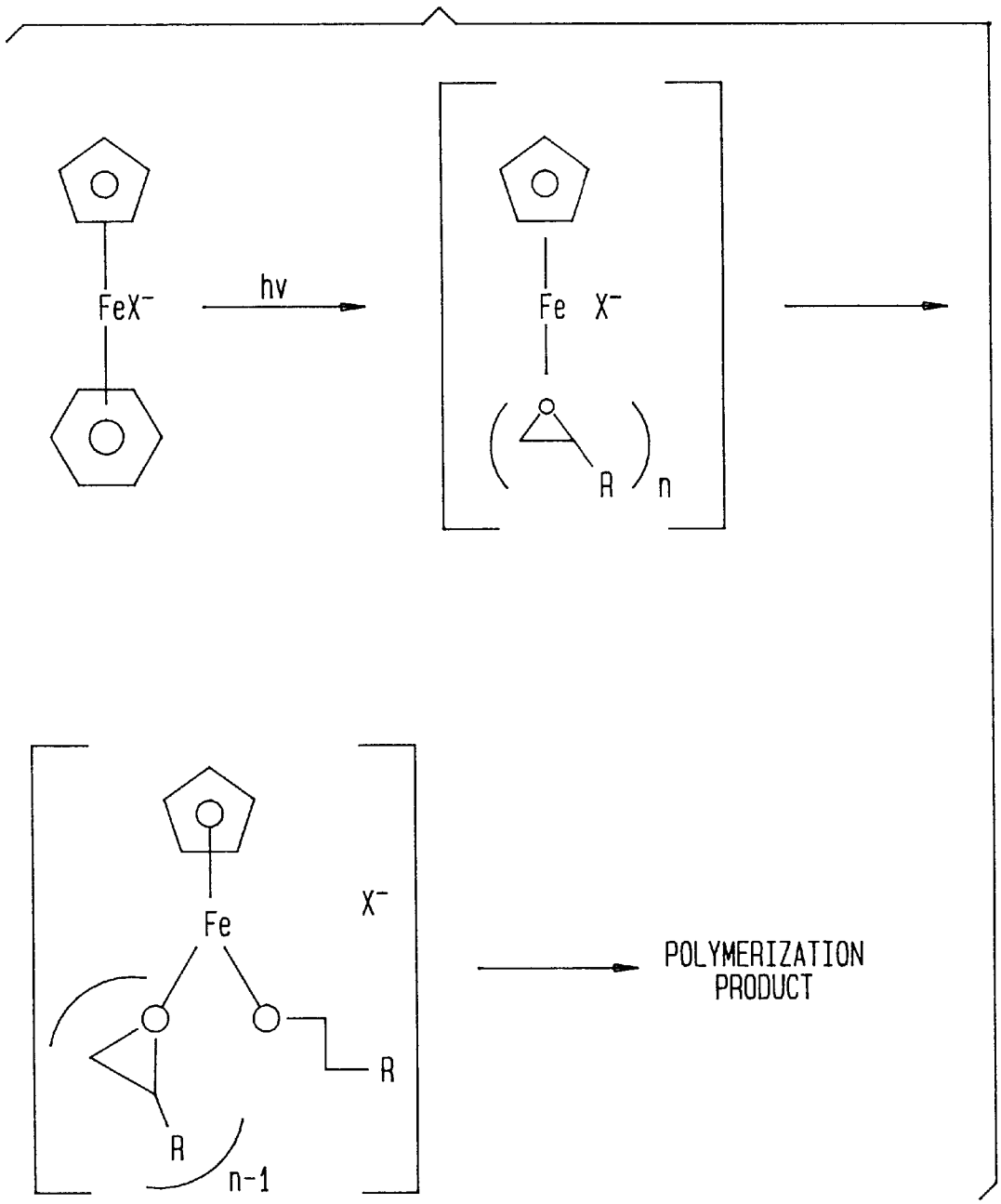
FIG. 3 is a scheme exemplifying the general principle of epoxide polymerization with iron arene complexes.

Thermosetting resins possess a number of attractive properties such as low dielectric constant, excellent thermal stability, low moisture uptake, high glass transition temperature, and good melt or solution processability characteristics. Other attractive properties of these thermosetting resins include, methyl ethyl ketone (MEK) solubility, no volatile formation upon curing, and outstanding adhesive properties.

However, use of these thermosetting materials in electronic packaging applications (e.g., prepregs, laminates, circuit boards, photoimageable dielectrics) is limited due to their brittle nature which makes them susceptible to cracking when stressed or during processing such as via formation, for example, by drilling. This inherent brittleness is due to the high crosslink density of the networks which results in poor fracture toughness. Although there have been significant efforts to enhance the fracture toughness of the aforementioned thermosetting resins, further improvement in the mechanical properties of these materials is required in order to make them useful in electronic packaging applications.

One aspect of the present invention comprises a cyanate resin and a fluorine-containing thermoplastic homo-, co-, or multicomponent thermoplastic polymer which is soluble in the cyanate resin melt. Said thermoplastic polymer undergoes an in-situ phase separation process during cure to form a microphase separated multiphase thermoset material. This morphology results in improved mechanical properties (i.e., enhanced fracture toughness) and drillability without microcracking. The modifiers suitable for use are tough, ductile fluorine-containing poly(arylene ether) engineering thermoplastics possessing relatively high glass transition temperatures (Tg).

More particularly, the modifiers are custom synthesized (non-commercial) thermoplastic polymers which have been synthesized/designed to be highly compatible with the cyanate resin. High compatibility is essential to achieve microphase separation and improved mechanical properties (i.e., enhanced fracture toughness).

The fluorine-containing homo-, co-, or multicomponent thermoplastic polymer utilized to toughen the cyanate resins is methyl ethyl ketone (MEK) soluble. This is unique because most high T$_g$ engineering thermoplastics are typically only soluble in polar aprotic solvents such as N-methyl-2-pyrrolidinone, dimethylacetamide, etc. or chlorinated solvents such as chloroform, methylene chloride, etc. which are unacceptable in the manufacturing of many electronic articles. MEK solubility is designed into the thermoplastic by the incorporation of fluorine onto the backbone of the thermoplastic modifier.

Cyanate ester resins are bisphenol/phenolic derivatives containing the ring-forming cyanate functional group. This family of thermosetting monomers and prepolymer are esters of bisphenols and cyanic acid which cyclotrimerize to form substituted triazine rings upon heating. Conversion, curing, to high Tg thermoset material results in the formation of three-dimensional networks of oxygen-linked triazine rings and bisphenol units, correctly termed polycyanurates. The cyclotriamerization reaction is classified as an addition polymerization.

The cyanate structures embodied within the scope of the present invention have the structural element of the formula (III):

$$N\equiv C-O\text{-}[R]\text{-}O-C\equiv N \tag{III}$$

wherein R is an aliphatic or aromatic moiety or group of chemical substituents which optionally may contain additional cyanate ester moieties and n is 1–20.

The cyanate that can be used pursuant to the present invention also comprises prepolymers of said monomer or blends thereof.

Some examples of cyanate ester compounds include: cyanatobenzene, 1,3- and 1,4-dicyanatobenzene, 2-tert-butyl-1,4-dicyanatobenzene, 2,4-dimethyl-1,3-dicyanatobenzene, 2,5-ditert-butyl-1,4-dicyanatobenzene, tetramethyl-1,4-dicyanatobenzene, 4-chloro-1,3-dicyanatobenzene, 1,3,5-tricyanatobenzene, 2,2'- or 4,4'-dicyanatobiphenyl, 3,3',5,5'-tetramethyl-4,4'dicyanatobiphenyl, 1,3-, 1,4-, 1,5-, 1,6-, 1,8-, 2,6-, or 2,7-dicyanatonaphthalene, 1,3,6-tricyanatonaphthalene, bis(4-cyanatophenyl)methane, bis(3-chloro-4-cyanatophenyl) methane, 2,2-bis(4-cyanatophenyl)propane, 2,2-bis(3,5-dichloro-4-cyanatophenyl)propane, 2,2-bis(3,5-dibromo-4-cyanatophenyl)propane, bis(4-cyanatophenyl)ether, bis(p-cyanophenoxyphenoxy)-benzene, di(4-cyanatophenyl) ketone, bis(4-cyanatophenyl)thioether, bis(4-cyanatophenyl)sulfone, tris(4-cyanatophenyl)phosphite, and tris(4-cyanatophenyl)phosphate. Also useful are cyanic acid esters derived from phenolic resins as disclosed in U.S. Pat. No. 3,962,184, cyanated novolak derived from novolak described in U.S. Pat. No. 4,022,755, cyanated bisphenol type polycarbonate oligomer derived from bisphenol types polycarbonate oligomer listed in U.S. Pat. No. 4,026,913, cyanato-terminated polyarylene ethers listed in U.S. Pat. No. 3,595,900, dicynate esters described in U.S. Pat. No. 4,740, 584, mixtures of di-and tricyanates listed in U.S. Pat. No. 4,709,008, polyaromatic cyanates containing polycyclic aliphatic diradicals such as XU7178, Dow Chemical Co., of U.S. Pat. No. 4,528,366, fluorocarbon cyanates described in U.S. Pat. No. 3,733,349, and other novel cyanate compositions taught in U.S. Pat. Nos. 4,195,132 and 4,116,946, all of which are incorporated herein by reference.

The homo-, co-, or multicomponent fluorine-containing thermoplastic polymers utilized as modifiers in accordance with the present invention contain:

1–100 mol % of a repeating structural element of the formula (IV)

     (IV)

and 99-0 mol % of a repeating structural element of the formula (V)

     (V)

and 99-0 mol % of a repeating structural element of the formula (VI)

Figure 4:
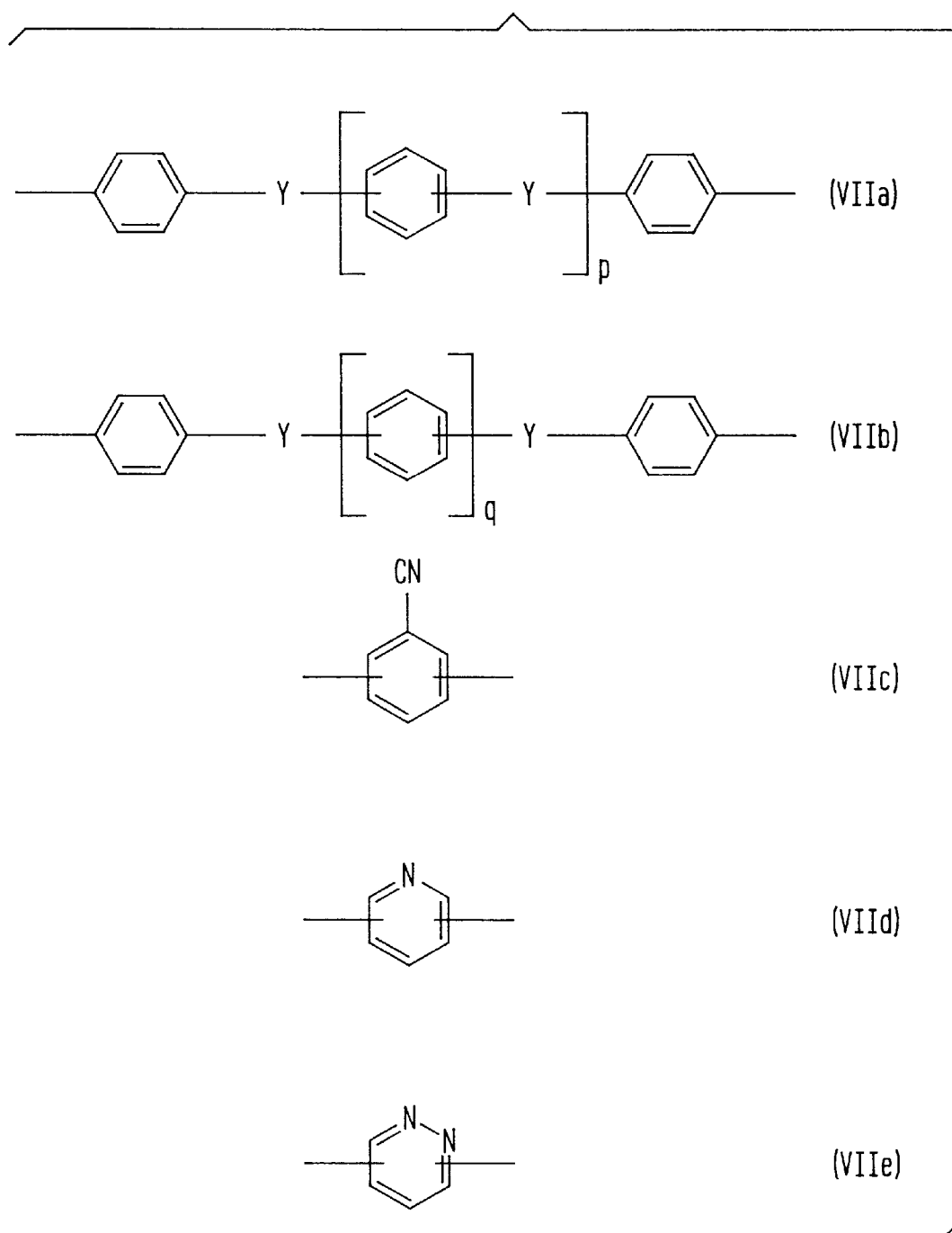
FIG. 4 represents formulas (VIIa) to (VIIe) for R$_1$ in Formulas (IV), (V), and (VI).
Figure 5:
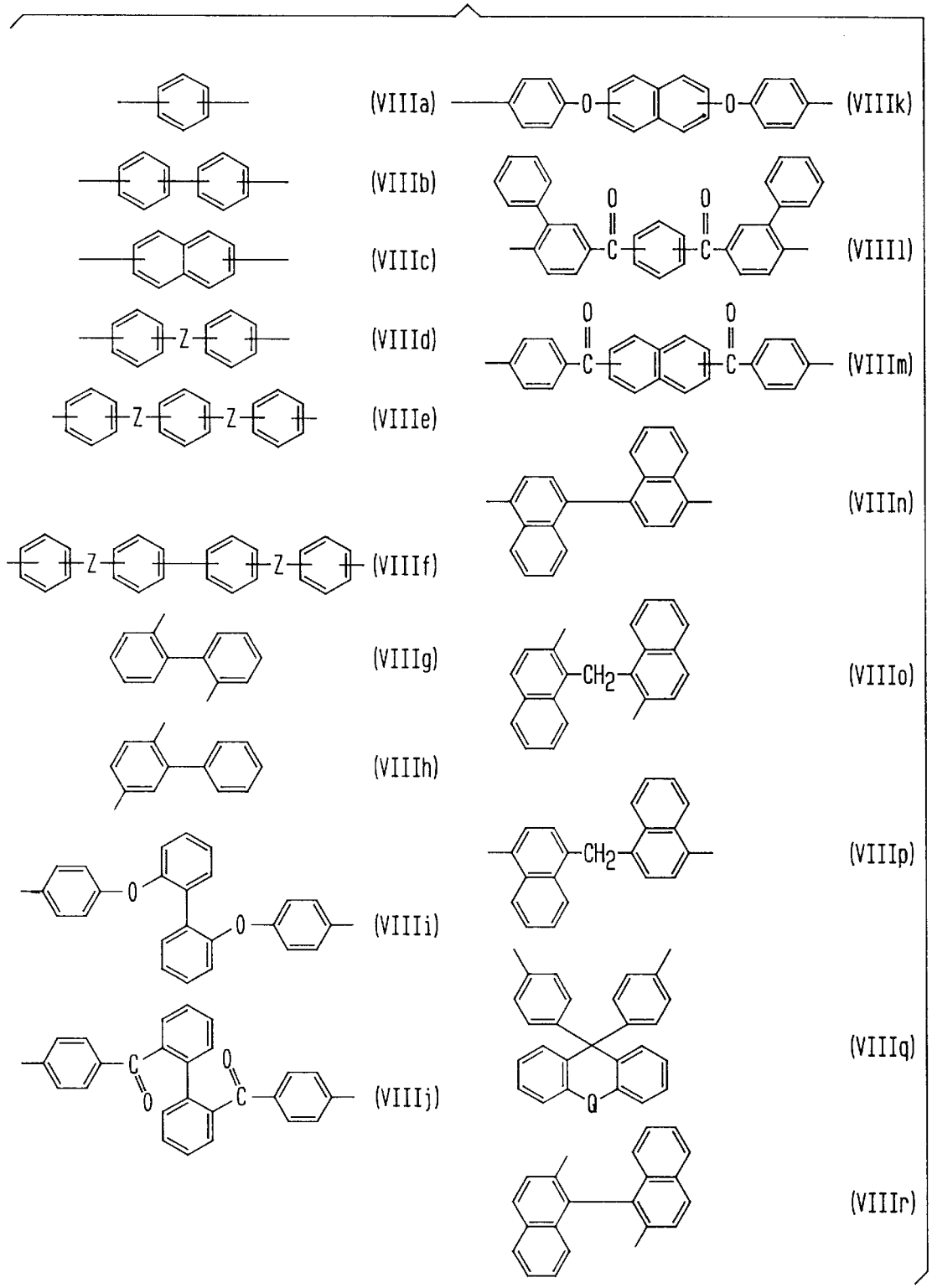
FIG. 5 represents formulas (VIIIa) to (VIIIr) for R$_2$, R$_3$, and R$_4$ in Formulas (IV), (V), and (VI).

     (VI)

wherein X is any group capable of reacting with a cyanate functionality such as a hydroxyl or cyanate group, and n=1–100; and where $R_1$ represents bivalent aromatic groups of the formulas (VIIa) to (VIIe) as shown in FIG. 4.

wherein Y represents —CO—, —PO($C_6H_5$)—, —S—, —SO— or —$SO_2$—, p signifies the number 0, 1, or 2 and Q is the number 2 or 3, $R_2$, $R_3$, and $R_4$ signify a bivalent aromatic group of the formulas (VIIIa) to (VIIIr) as shown in FIG. 5.

wherein Q represents a direct bond, —$CH_2$—, —O— or —CO—, and Z represents —$CH_2$— —C($CH_3$)($C_6H_5$)—, —C($CF_3$)$_2$—, —C($CH_3$)$_2$—, C($CF_3$)($C_6H_5$)—, —PO($C_6H_5$)—, —S—, —O—, —$SO_2$—, or —CO— wherein the aromatic rings of the formulas (VIIa)–(VIIe) are unsubstituted or are substituted by one or more halogen atoms and/or ($C_1$–$C_5$) alkyl groups which may be fluorine containing or ($C_1$–$C_5$) alkoxy groups which may be fluorine-containing and wherein the aromatic rings of the formulas (VIIIa)–(VIIIr) are unsubstituted or are substituted by one or more halogen atoms and/or ($C_1$–$C_5$) alkoxy groups or ($C_1$–$C_5$) alkyl groups which may contain fluorine.

Examples of such alkyl groups are methyl, ethyl, n-propyl, isopropyl, n-butyl, sec-butyl, or tert-butyl.

Examples of such alkyl groups are methoxy, ethoxy, n-propoxyl, isopropoxy, n-butoxy, or tert-butoxy.

Figure 6:
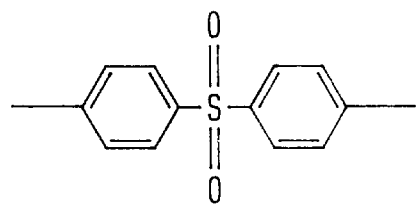
FIG. 6 shows the preferred chemical structure for R$_1$ in Formulas (IV), (V), and (VI).
Figure 6:
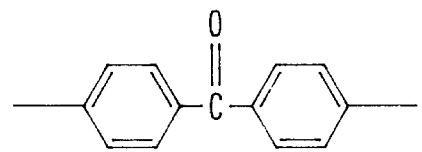
Figure 6:
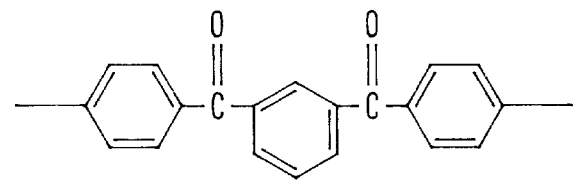
Figure 6:
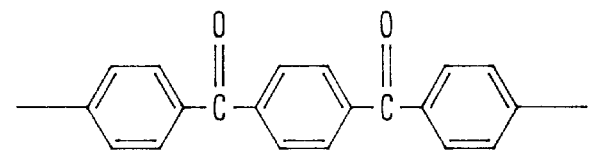
Figure 6:
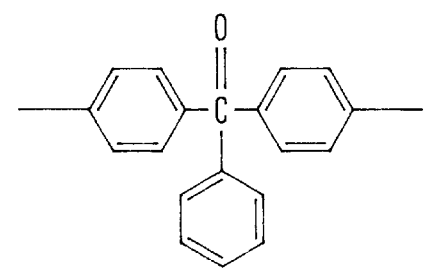
Figure 6:
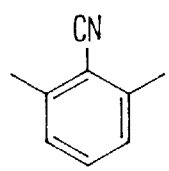
Figure 7:
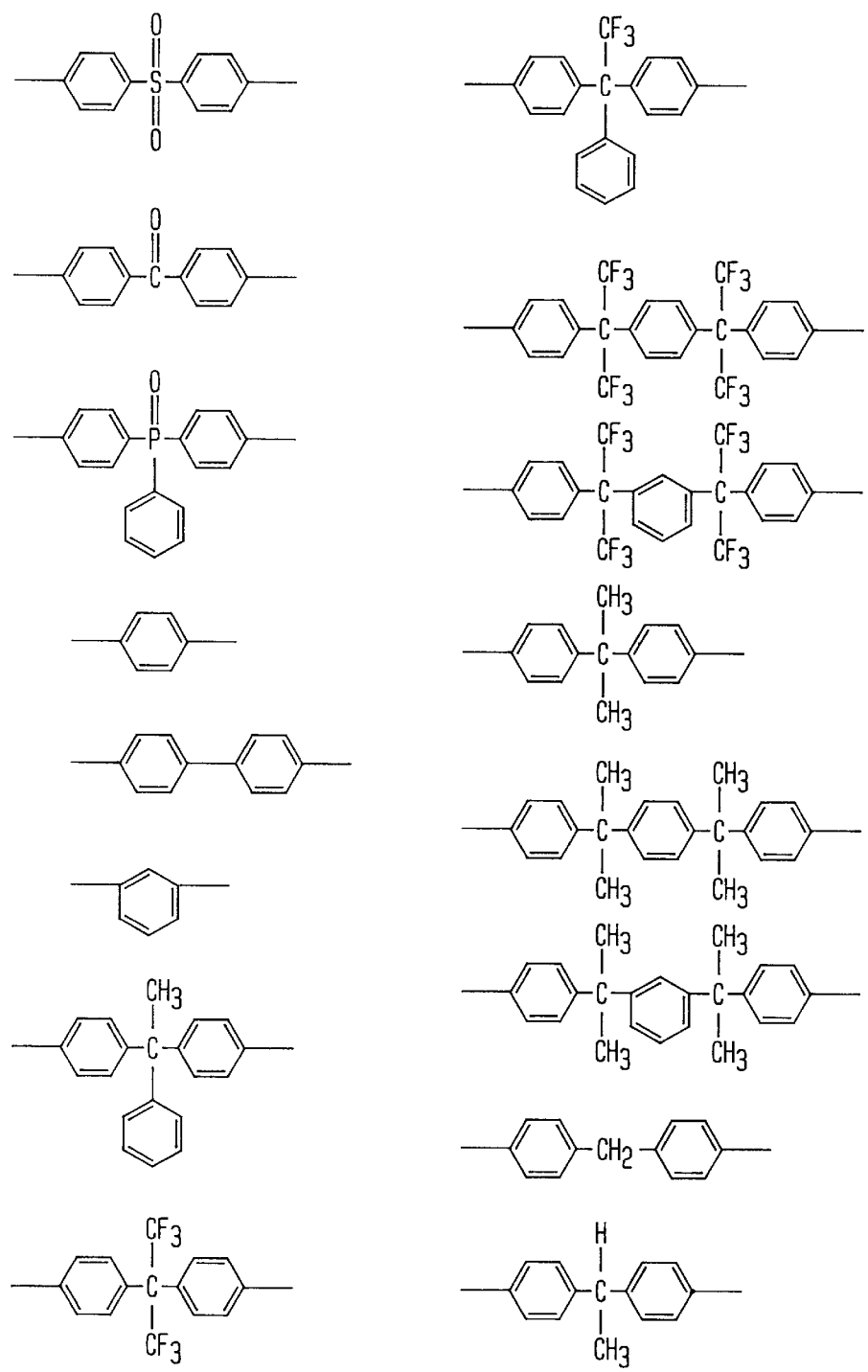
FIG. 7 shows the preferred chemical structures for R$_2$, R$_3$, and R$_4$ in the Formulas (V), (V), and (VI).

$R_1$ in the Formulas (IV), (V), and (VI) advantageously represents the chemical structures depicted in FIG. 6. $R_2$, $R_3$, and $R_4$ in the Formulas (IV), (V), and (VI) preferably represent the chemical structures depicted in FIG. 7, wherein the aromatic rings are unsubstituted or are substituted by one or more halogen atoms and/or ($C_1$–$C_5$) alkyl groups which may contain fluoride or ($C_1$–$C_5$) alkoxy groups which may contain fluorine. In especially preferred components of the fluorine-containing thermoplastic multicomponent polymer, $R_1$ in particular represents a group of the formula (VII) as shown in FIG. 4.

In particular $R_1$ preferably represents a group of the formula:

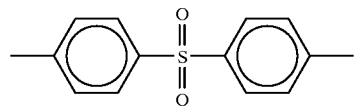

and in particular $R_3$ preferably represents a group of the formula (VIII):

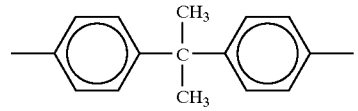

Organometallic compounds useful in the present invention can be prepared as described in the literature methods and as known to those skilled in the art; examples are shown in Inorg. Chem. 17, 1003 (1978), Chem. Ber. 102, 2449 (1969), J. Organomet. Chem. 135, 373 (1977), Inorg. Chem. 18, 553 (1979), those methods disclosed in EP 109851, EP 094914, EP 094915 and EP 0109851. The curing agent can be present in the range of 0.01 to 20, preferably 0.1 to 10 weight percent of the total composition.

Examples of sulfonium salts are arylacyldialkyl and hydroxyaryldialkyl sulfonium salts represented by the formulae (IX) and (X):

     (IX)

Figure 8:
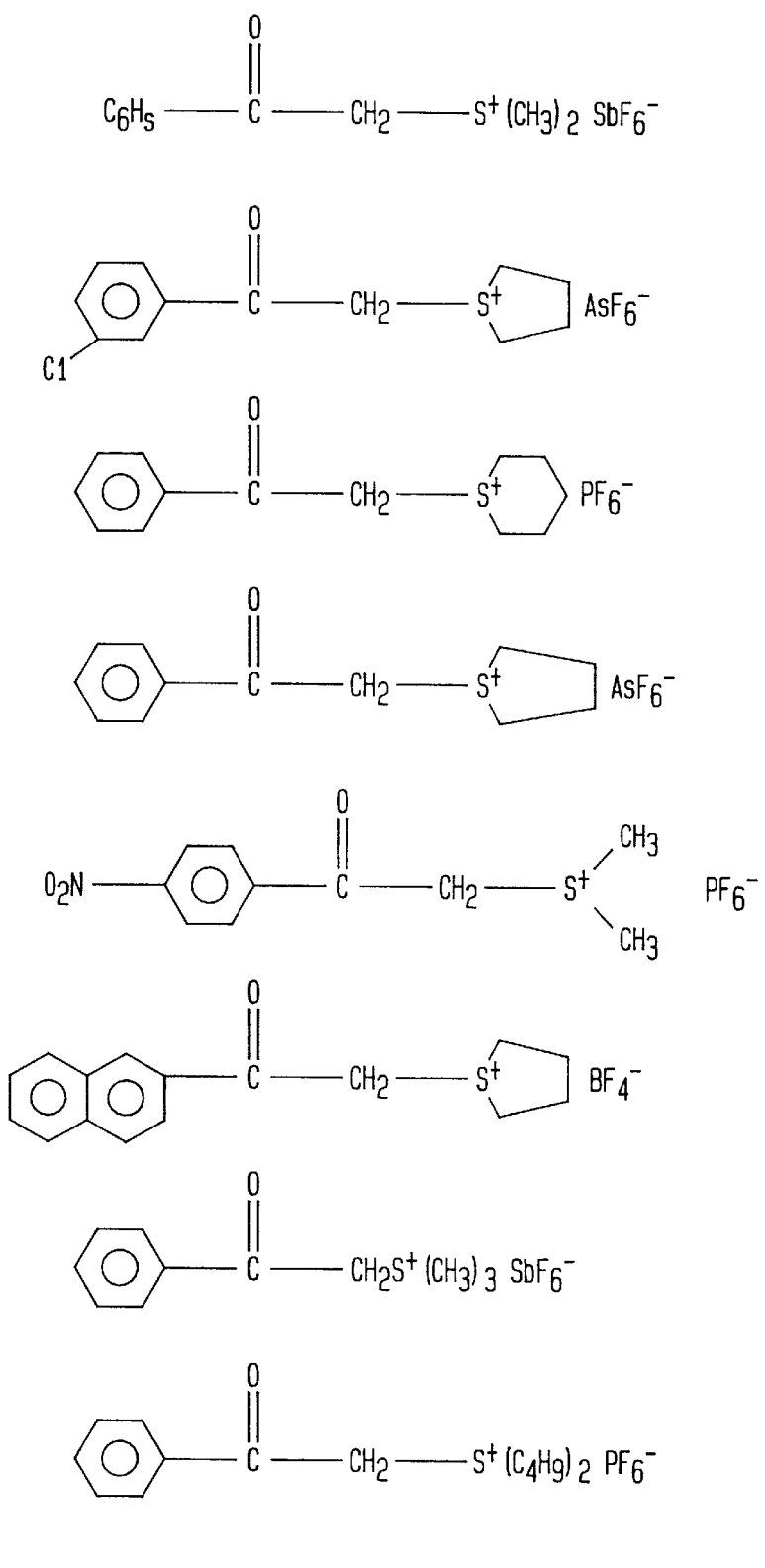
FIG. 8 shows possible examples of arylacyldialkyl sulfonium salts.
Figure 9:
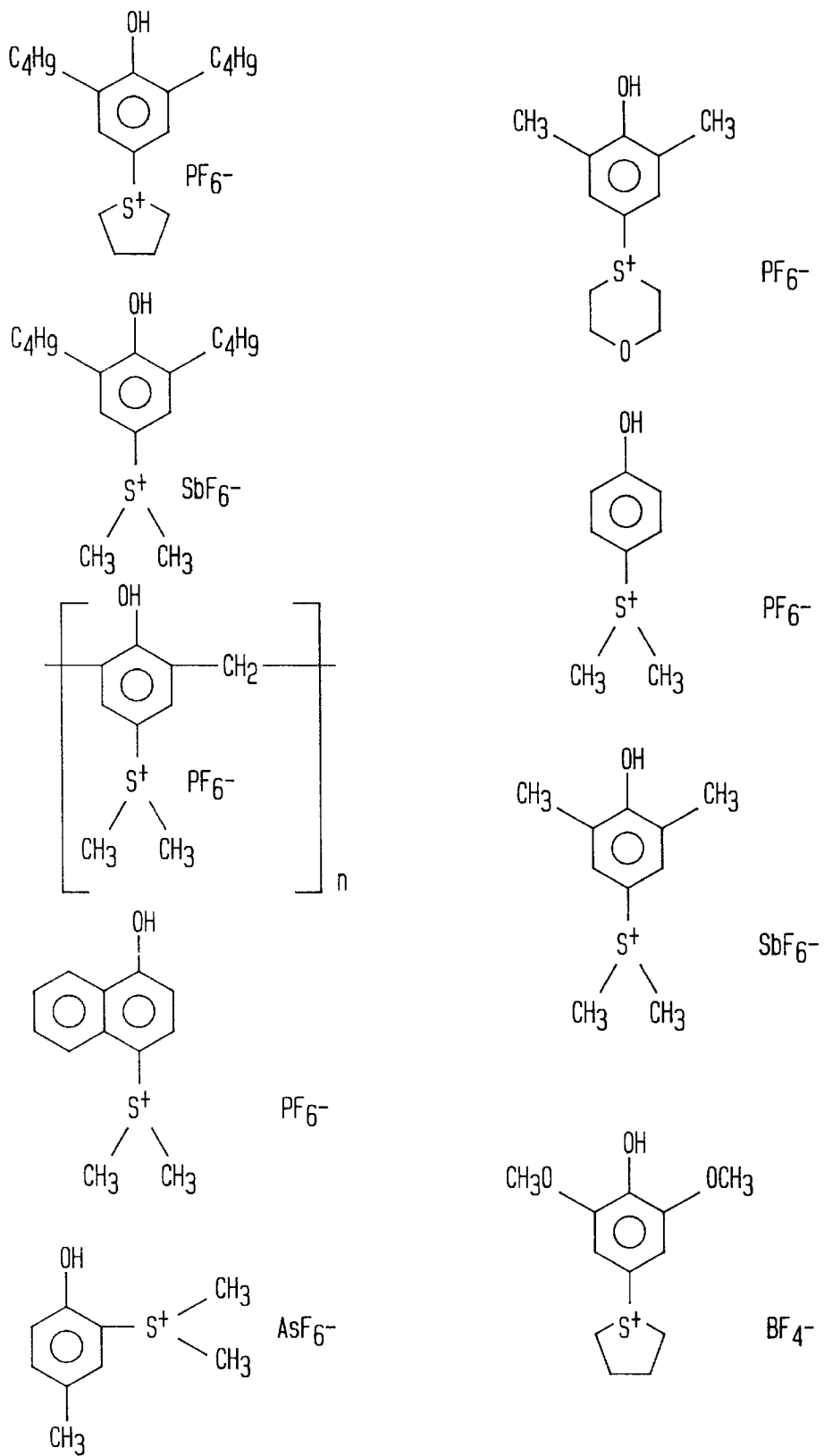
FIG. 9 shows possible examples of hydroxyaryl dialkyl salts.
Figure 10:
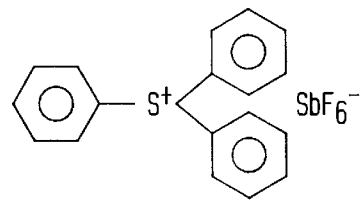
FIG. 10 shows other photoinitiators which might be suitable.
Figure 10:
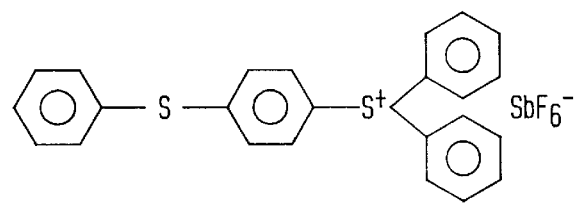
Figure 10:
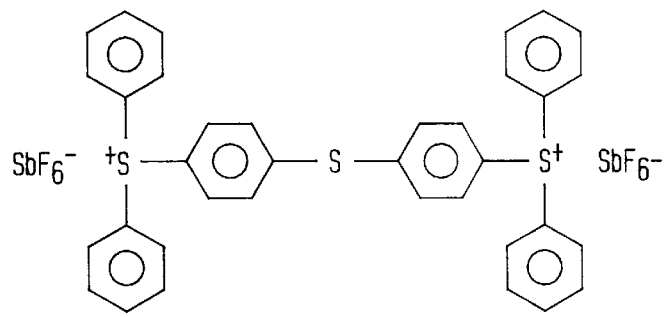
Figure 10:
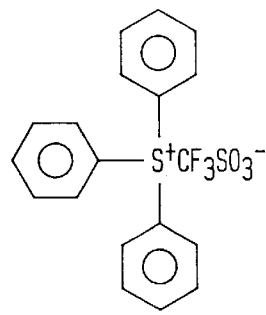

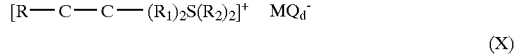     (X)

where R is a $C_{6–13}$ monovalent aromatic organic radical or substituted $C_{(6–13)}$ monovalent aromatic radical; R1 is a monovalent radical selected from hydrogen, $C_{(1–8)}$ alkyl and mixtures thereof; R2 is a monovalent $C_{1–13}$ organic radical; R3 is a monovalent radical selected from $C_{(1–80)}$ alkyl, hydroxy, $C_{(1–8)}$ alkoxy, halo and nitro; R4 is a $C_{(1–8)}$ alkyl radical; M is a metal or metalloid; Q is halogen; and d is equal to 4–6. Examples of arcylacyldialkyl sulfonium salts are shown in FIG. 8. Examples of hydroxyaryl dialkyl sulfonium salts are shown in FIG. 9. Other suitable photoinitiators are shown in FIG. 10.

When a negative working photoresist is desired, the initiator employed is one which will generate a Lewis acid upon exposure to actinic light. Examples of such photoinitiators are well-known and include iron arenes. Various suitable photoinitiators are discussed in Meier et al., "Photoinitiated Cationic Polymerization of Epoxides with Iron-Arene Complexes," Journal of Radiation Curing, October 1986, pp. 26–32; Meier et al., "Imaging with Iron Arene Photoinitiators", "Journal of Imaging Science", Vol 30, No. 4, July/August 1986, pp 174–177; Zweifel et al., "Imaging with Cationic Organometalic Photoinitiators", Polymer Preprint, Vol. 26(2), 1985, pp. 347–348; and Meier, "Photopolymerization of Epoxides—A New Class of Photoinitiators Based on Cationic Iron Arene Complexes", Society of Manufacturing Engineers, Technical Paper FC-85417, 1985, disclosures of which are incorporated herein by reference. Examples of some iron arene photoinitiators are represented by the formula (XI):

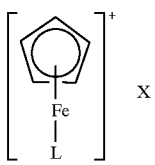
(XI)

where L is an aryl group such as phenol, naphthyl, and anthracyl; and X is a non-nucleophilic anion such as $SbF_6^-$, $PF_6^-$, $AsF6^-$, $BF_4^-$, $CF_3SO_3^-$, or $ClO_4^-$. Such iron arenes are commercially available, including Ciba-Geigy's Irgacure 261.

The photoinitiator employed is present in a sufficient amount to either retard or initiate the polymerization of the cyanate ester, depending upon the type of photoinitiator employed. Usually the amount of photoinitiator is about 0.5% to about 10% by weight and preferably about 3% to about 5% by weight based upon the solid resin weight.

If desired, the composition can also include a free radical initiator, such as peroxide including cumyl peroxide to increase the speed of the photoinitiation. It is believed that free radicals facilitate the decomposition of iron arenes generating acid. When employed, such is usually present in amounts up to about 5% and preferably about 0.005% to about 3% by weight of the solid resin weight.

If desired, in the case of negative photoresists, the compositions can also include catalysts to promote the polymerization of the cyanate ester. Such catalysts include Lewis acids, such as aluminum chloride, boron trifluoride, ferric chloride, titanium chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, and copper actylacetonate or octoates or naphthenates. The amount of the catalyst used can vary, and generally will be 0.005 to 5 weight percent, preferably 0.05 to 0.5 weight percent based on total solid resin weight.

Furthermore, if desired, the composition can include one or more photosensitizers. Suitable photosensitizers include perylene(peri-dinaphthalene), anthracene derivatives (ex. 9-methylanthracene), dyes (e.g., acridine orange, acridine yellow, benzoflavin).

When employed, the photosensitizer is usually present in amounts of up to about 3% by weight and preferably about 0.1% to about 1.5% by weight based upon the total solids weight content of the composition.

The present invention also provides a process for the polymerization of cyanate compositions, comprising the steps of:
a) providing at least one cyanate monomer;
b) adding to the monomer a catalytically effective amount of an organometallic compound, a thermoplastic compatible fracture resistant modifier having solvent compatibility and a solvent in the amount of zero to 99 weight percent, thereby forming a polymerizable mixture, and
c) allowing the mixture to polymerize or adding radiative energy to the composition to impart polymerization.

There is also provided a method for preparing coated substrates or films with the said compositions of the invention comprising the steps of:
a) providing a substrate or film,
b) coating an energy polymerizable mixture as described above onto at least on a surface of said substrate or film by methods known in the art, such as bar, knife, reverse roll, curled roll, or spin coatings, or by dipping, spraying, brushing, and the like, with or without a coating solvent, and
c) applying energy to the coated substrate to impart the polymerization of the coating.

Such compositions are to be used in high temperature stable resists or permanent dielectrics for making printed circuit boards exhibiting excellent dielectric properties, flame resistance, low temperature processability and toughness.

EXAMPLE 1

About 90 g of AroCy B-30 from Ciba were dissolved in 30 ml of methyl ethyl ketone by roll milling and warming to 50 C for a few minutes. From this solution 20 g samples were taken and placed in three separate containers.

EXAMPLE 2

In container A, 5 g of AroCy B-30, 0.05 g of 10% solution of 8% Zinc octanoate in mineral spirits and 0.075 g of Irgacure 261 were introduced.

EXAMPLE 3

In container B, 5 g of MR283-350, 0.05 g of Zn Octanoate (as above) and 0.075 g of Irgacure 261 were added.

EXAMPLE 4

In container C, 3 g of PSF modifier, 2 g of AroCy B-30, 0.05 of Zinc octanoate and 0.075 G of Irgacure 261 were added.

EXAMPLE 5

Each sample was roll milled for 1 hr after addition and coated on the rough side of 1 oz Copper foil (Gould) with a 2 mil knife. Samples were air dried for 30 seconds, baked for 15 min at 130° C. and exposed for 300 sec (350 W Oriel Lamp). Samples were then baked for 20 min at 120° C. developed in about 40 sec in butyrolactone, rinsed with MEK followed by air blow off and subsequently baked at 150° C. for 15 minutes. The resulting images produced by Examples 3 and 4 were of good quality and did not appear to crack upon a 90 degree bend test. In contrast, images produced from Example 2 showed cracking upon baking.

We claim:
1. A process of making a photosensitive, curable admixture, comprising the steps of:
dissolving a halogen-containing thermoplastic modifier in a thermosetting material selected from the group consisting of a cyanate resin, a cyanate resin prepolymer and blends thereof;
including therm a photosensitive agent;
wherein said reactive halogen-containing thermoplastic polymer modifier is selected from the group consisting of a fluorine-containing homocomponent reactive thermoplastic modifier, a fluorine-containing co-component reactive thermoplastic modifier, a fluorine-containing multicomponent reactive thermoplastic modifier, a bromine-containing homocomponent reactive thermoplastic modifier, a bromine-containing co-component reactive thermoplastic modifier and a bromine-containing multicomponent reactive thermoplastic modifier polymers which are soluble in methyl ethyl ketone;

wherein said reactive halogen-containing thermoplastic modifier comprises about 1 to about 100 mol. % of a repeating structural element of the formula:

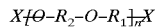

and about 99 to about 0 mol. % of a repeating structural element of the formula:

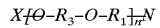

and about 99 to about 0 mol. % of a repeating structural element of the formula:

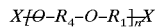

wherein X is any group capable of reacting with a cyanate functionality and n=1–100; and where $R_1$ represents bivalent aromatic groups of the formula:

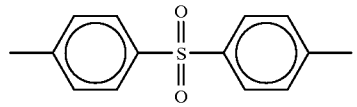

and in particular $R_2$ preferably represents a group of the formula:

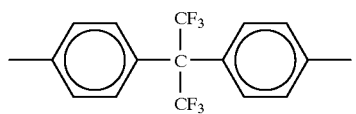

and in particular $R_1$ preferably represents a group of the formula:

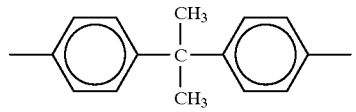

2. The process defined in claim 1, including the step of including therein a polymerization catalyst.

3. The process defined in claim 2, including the step of including therein a free radical initiator.

4. The process defined in claim 2, including the step of curing said admixture such that the cured state comprises a toughened microphase separated multiphase thermoset material.

5. The process of forming an patterned image by providing on a substrate, a photosensitive curable admixture made from the process of claim 4, exposing the cured admixture to actinic light in preselected areas, and removing the unexposed cured areas.

* * * * *